(12) United States Patent
Do et al.

(10) Patent No.: US 8,519,518 B2
(45) Date of Patent: Aug. 27, 2013

(54) INTEGRATED CIRCUIT PACKAGING SYSTEM WITH LEAD ENCAPSULATION AND METHOD OF MANUFACTURE THEREOF

(75) Inventors: Byung Tai Do, Singapore (SG); Reza Argenty Pagaila, Singapore (SG); Linda Pei Ee Chua, Singapore (SG); Arnel Senosa Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 230 days.

(21) Appl. No.: 12/890,409

(22) Filed: Sep. 24, 2010

(65) Prior Publication Data
US 2012/0074547 A1  Mar. 29, 2012

(51) Int. Cl.
*H01L 23/495* (2006.01)

(52) U.S. Cl.
USPC ........... 257/676; 257/666; 257/669; 257/670; 257/672; 257/680; 438/106; 438/110; 438/121; 438/124; 438/127

(58) Field of Classification Search
None
See application file for complete search history.

(56) References Cited

U.S. PATENT DOCUMENTS

| | | | |
|---|---|---|---|
| 6,483,178 B1 * | 11/2002 | Chuang | 257/672 |
| 6,661,083 B2 * | 12/2003 | Lee et al. | 257/676 |
| 7,078,271 B2 | 7/2006 | Mahle | |
| 7,214,326 B1 * | 5/2007 | Yang et al. | 216/13 |
| 2004/0084757 A1 * | 5/2004 | Seo | 257/672 |
| 2008/0258278 A1 * | 10/2008 | Ramos et al. | 257/676 |

* cited by examiner

*Primary Examiner* — Kyoung Lee
(74) *Attorney, Agent, or Firm* — Ishimaru & Associates LLP; I-Chang John Yang

(57) ABSTRACT

A method of manufacture of an integrated circuit packaging system includes: forming a package paddle; forming a lead adjacent the package paddle, the lead having a hole in a lead body top side and a lead ridge protruding from a lead non-horizontal side; mounting an integrated circuit over the package paddle; connecting an electrical connector to the lead and the integrated circuit; and forming a fill layer within the hole.

16 Claims, 6 Drawing Sheets

INTEGRATED CIRCUIT PACKAGING SYSTEM WITH LEAD ENCAPSULATION AND METHOD OF MANUFACTURE THEREOF

TECHNICAL FIELD

The present invention relates generally to an integrated circuit packaging system, and more particularly to a system for encapsulation.

BACKGROUND ART

Semiconductor chips have become progressively more complex, driven in large part by the need for increasing processing power. Increase in power is needed in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package paddle; forming a lead adjacent the package paddle, the lead having a hole in a lead body top side and a lead ridge protruding from a lead non-horizontal side; mounting an integrated circuit over the package paddle; connecting an electrical connector to the lead and the integrated circuit; and forming a fill layer within the hole.

The present invention provides an integrated circuit packaging system, including: a package paddle; a lead adjacent the package paddle, the lead having a hole in a lead body top side and a lead ridge protruding from a lead non-horizontal side; an integrated circuit over the package paddle; an electrical connector connected to the lead and the integrated circuit; and a fill layer within the hole.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
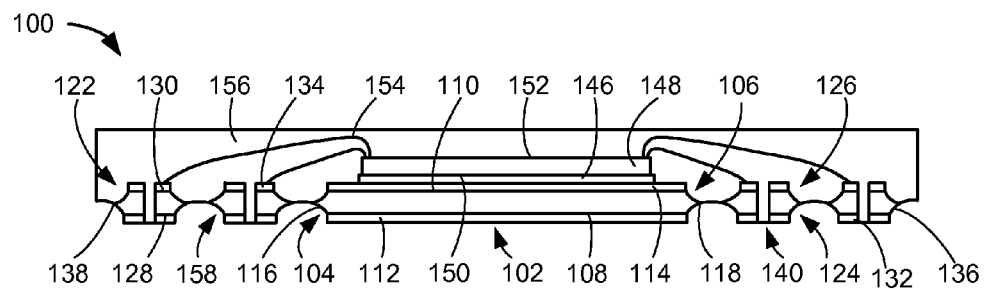
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
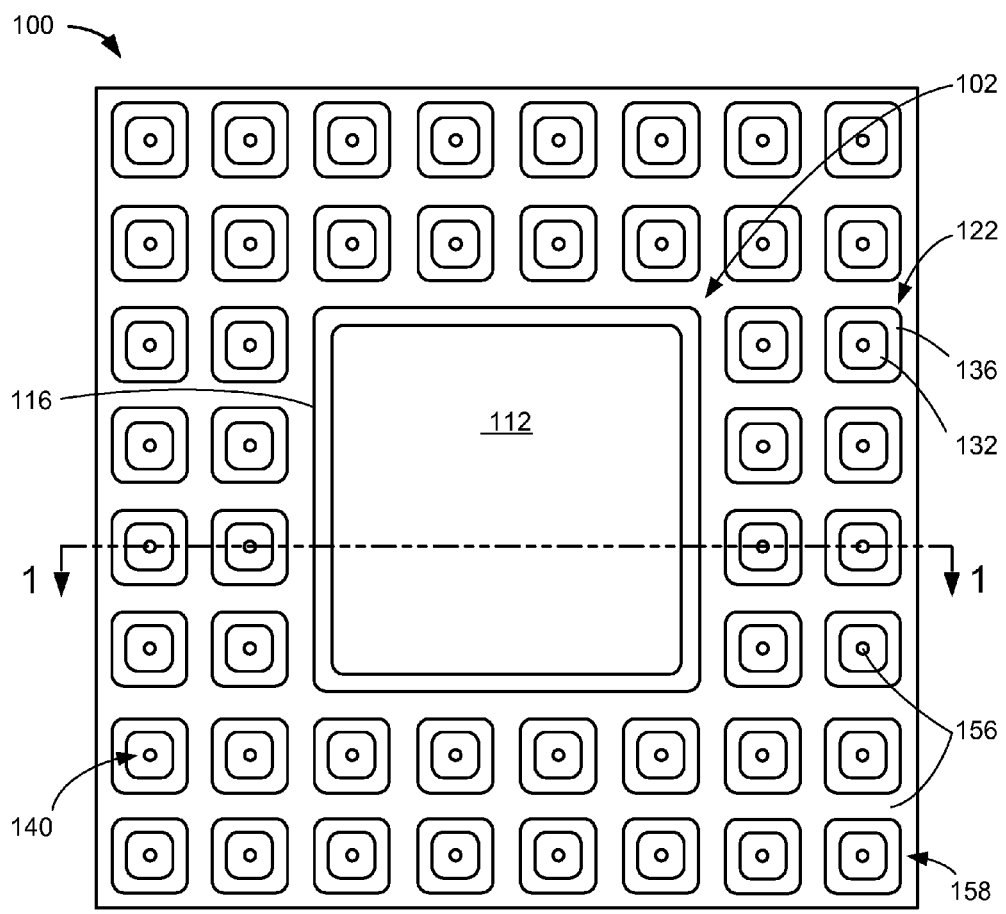
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a standoff quad flat nolead (QFN) with through hole lead locks.

The integrated circuit packaging system 100 can include a package paddle 102, which is a support structure for mounting a semiconductor device thereon. The package paddle 102 can include a paddle body bottom portion 104 and a paddle body top portion 106 above the paddle body bottom portion 104.

The paddle body bottom portion 104 and the paddle body top portion 106 are a lower central portion and an upper central portion of the package paddle 102, respectively. The paddle body bottom portion 104 and the paddle body top portion 106 can include a paddle body bottom side 108 and a paddle body top side 110, respectively, opposite the paddle body bottom side 108.

The package paddle 102 can include a conductive paddle bottom layer 112 and a conductive paddle top layer 114, which provide electrical connectivity. The conductive paddle bottom layer 112 and the conductive paddle top layer 114 can be formed directly on the paddle body bottom side 108 and the paddle body top side 110, respectively.

The package paddle 102 can include a paddle ridge 116, which is a protrusion of the package paddle 102. For illustrative purposes, the paddle ridge 116 is shown with a lower surface and an upper surface having a shape of a curve, although it is understood that the lower surface and the upper surface of the paddle ridge 116 can include any other shapes. The upper surface of the paddle ridge 116 is opposite and above the lower surface of the paddle ridge 116.

The paddle ridge 116 laterally extends from the paddle body bottom portion 104 and the paddle body top portion 106. The paddle ridge 116 includes a top portion and a bottom portion laterally extending from the paddle body bottom portion 104 and the paddle body top portion 106, respectively.

The lower surface of the paddle ridge 116 extends from the paddle body bottom side 108 to a paddle tip 118, which is an end of the paddle ridge 116 facing away from the paddle body bottom portion 104 and the paddle body top portion 106. The upper surface of the paddle ridge 116 extends from the paddle body top side 110 to the paddle tip 118. The lower surface of the paddle ridge 116 and the upper surface of the paddle ridge 116 can be below and above, respectively, the paddle tip 118.

The paddle tip 118 can be between a plane of a portion of the paddle body bottom side 108 and a plane of a portion of the paddle body top side 110. The paddle body bottom portion 104 and the paddle body top portion 106 can be above and below, respectively, a plane of the paddle tip 118.

The integrated circuit packaging system 100 can include a lead 122, which provides electrical connectivity to external systems (not shown). The lead 122 can be adjacent the package paddle 102. A number of the lead 122 can be formed in multiple rows.

The lead 122 can include a lead body bottom portion 124 and a lead body top portion 126 above the lead body bottom portion 124. The lead body bottom portion 124 and the lead body top portion 126 are a lower central portion and an upper central portion of the lead 122, respectively. The lead body bottom portion 124 and the lead body top portion 126 can include a lead body bottom side 128 and a lead body top side 130, respectively, opposite the lead body bottom side 128.

The lead 122 can include a conductive lead bottom layer 132 and a conductive lead top layer 134, which provide electrical connectivity. The conductive lead bottom layer 132 and the conductive lead top layer 134 can be formed directly on the lead body bottom side 128 and the lead body top side 130, respectively.

The lead 122 can include a lead ridge 136, which is a protrusion of the lead 122. For illustrative purposes, the lead ridge 136 is shown with a bottom surface and a top surface having a shape of a curve, although it is understood that the bottom surface and the top surface of the lead ridge 136 can include any other shapes. The upper surface of the lead ridge 136 is opposite and above the lower surface of the lead ridge 136.

The lead ridge 136 laterally extends from the lead body bottom portion 124 and the lead body top portion 126. In other words, the lead ridge 136 includes a bottom portion and a top portion laterally extending from the lead body bottom portion 124 and the lead body top portion 126, respectively.

The lower surface of the lead ridge 136 extends from the lead body bottom side 128 to a lead tip 138, which is an end of the lead ridge 136 facing away from the lead body bottom portion 124 and the lead body top portion 126. The upper surface of the lead ridge 136 extends from the lead body top side 130 to the lead tip 138. The lower surface of the lead ridge 136 and the upper surface of the lead ridge 136 can be below and above, respectively, the lead tip 138.

The lead tip 138 can be between a plane of a portion of the lead body bottom side 128 and a plane of a portion of the lead body top side 130. The lead body bottom portion 124 and the lead body top portion 126 can be above and below, respectively, a plane of the lead tip 138.

The lead 122 can include a hole 140 formed through the conductive lead bottom layer 132, the lead body bottom portion 124, the lead body top portion 126, and the conductive lead top layer 134. The hole 140 can be formed in the lead body top side 130. The hole 140 can be formed extending from a bottom surface of the conductive lead bottom layer 132 to a top surface of the conductive lead top layer 134.

The integrated circuit packaging system 100 can include an attach layer 146. The attach layer 146 attaches an integrated circuit 148, which is a semiconductor device, to the conductive paddle top layer 114.

The integrated circuit 148 can be mounted over the conductive paddle top layer 114 with the attach layer 146. For illustrative purposes, the integrated circuit 148 is shown as a wirebond integrated circuit, although it is understood that the integrated circuit 148 can be any other semiconductor device including a flip chip.

The integrated circuit 148 can include an inactive side 150 and an active side 152 opposite the inactive side 150. The inactive side 150 can be attached to the conductive paddle top layer 114 with the attach layer 146.

The integrated circuit packaging system 100 can include an electrical connector 154, which connects the lead 122 and the integrated circuit 148. The electrical connector 154 can be connected to the conductive lead top layer 134 and the active side 152.

The electrical connector 154 can be connected to a peripheral portion of the integrated circuit 148 at the active side 152. The integrated circuit packaging system 100 can include a number of the electrical connector 154 connected to a number of the lead 122.

The integrated circuit packaging system 100 can include an encapsulation 156, such as a fill layer 156, which covers a semiconductor package to seal electrical devices providing mechanical and environmental protection. The encapsulation 156 can be formed over the conductive paddle top layer 114, the paddle ridge 116, the conductive lead top layer 134, and the lead ridge 136.

The encapsulation 156 can be formed within the hole 140. A plane of a portion of the encapsulation 156 within the hole 140 can be coplanar with a plane of a portion of a bottom surface of the conductive lead bottom layer 132.

The encapsulation 156 can cover a top surface of the paddle ridge 116, the conductive paddle top layer 114, a top surface of the lead ridge 136, the conductive lead top layer 134, the attach layer 146, the integrated circuit 148, and the electrical connector 154. The encapsulation 156 can be formed surrounding a top portion of the paddle ridge 116, the paddle body top portion 106, a top portion of the lead ridge 136, and the lead body top portion 126.

The encapsulation 156 can partially expose the package paddle 102 and the lead 122. The encapsulation 156 can expose a bottom surface of the paddle ridge 116, the conductive paddle bottom layer 112, a bottom surface of the lead ridge 136, and the conductive lead bottom layer 132.

The lead 122 can include a lead non-horizontal side 158, which is a lateral extent of the lead body bottom portion 124 and the lead body top portion 126. The lead non-horizontal side 158 is a side from which the lead ridge 136 protrudes.

It has been discovered that the lead 122 having the lead ridge 136 and the hole 140 filled with the encapsulation 156 solves problems of leads pulled out from an encapsulant due to lack of locking in a semiconductor package including a standoff quad flat nolead multi-row (QFN-mr) package, resulting in structure integrity without lead pullout and misalignment.

Further to the discovery, the encapsulation 156 filled in the hole 140 increases contact areas as well as friction between the encapsulation 156 and the lead 122, resulting in a significant reduction of occurrences of leads pulled out from the encapsulation 156.

Referring now to FIG. 2, therein is shown a bottom view of the integrated circuit packaging system 100. The integrated circuit packaging system 100 can include the package paddle 102 adjacent and surrounded by a number of the lead 122.

The lead 122 can be formed in a number of rows surrounding and spaced from a perimeter of the package paddle 102. The lead 122 can be electrically isolated from the package paddle 102.

The package paddle 102 can include the paddle ridge 116 extending from the conductive paddle bottom layer 112. For illustrative purposes, the paddle ridge 116 and the conductive paddle bottom layer 112 are shown with a shape of a square, although it is understood that the paddle ridge 116 and the conductive paddle bottom layer 112 can include any other shapes.

The lead 122 can include the lead ridge 136 extending from the conductive lead bottom layer 132. The lead 122 can include the lead non-horizontal side 158, from which the lead ridge 136 protrudes. For illustrative purposes, the lead ridge 136 and the conductive lead bottom layer 132 are shown with a shape of a square, although it is understood that the lead ridge 136 and the conductive lead bottom layer 132 can include any other shapes.

The encapsulation 156 can expose the conductive paddle bottom layer 112, the paddle ridge 116, the conductive lead bottom layer 132, and the lead ridge 136. The encapsulation 156 can be formed within the hole 140 surrounded by the conductive lead bottom layer 132.

Figure 3:
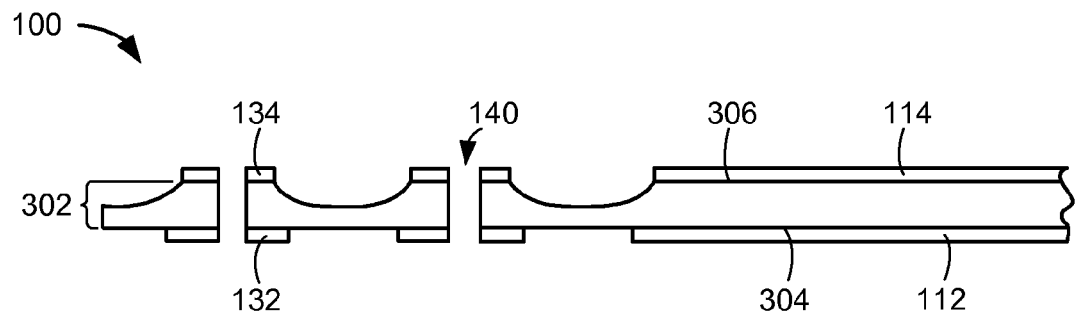
FIG. 3 is a cross-sectional view of a portion of the integrated circuit packaging system taken along line 1-1 of FIG. 2 in a providing phase of manufacture.

Referring now to FIG. 3, therein is shown a cross-sectional view of a portion of the integrated circuit packaging system 100 taken along line 1-1 of FIG. 2 in a providing phase of manufacture. The integrated circuit packaging system 100 can include a leadframe 302, which is a structure for mounting and connecting a semiconductor device thereto.

The leadframe 302 can be formed with an electrically conductive material including copper (Cu) or any other metallic material. For example, the leadframe 302 can include an incoming leadframe that is pre-formed. The term pre-formed means that the leadframe 302 is provided with a structure that has been plated, partially removed, or a combination thereof in the providing phase. Also for example, the leadframe 302 can include a structure of a strip or a sheet.

The integrated circuit packaging system 100 can include the conductive paddle bottom layer 112 and the conductive lead bottom layer 132 formed directly on a leadframe bottom surface 304 of the leadframe 302. The conductive paddle bottom layer 112 can be formed at a spacing from the conductive lead bottom layer 132.

The integrated circuit packaging system 100 can include the conductive paddle top layer 114 and the conductive lead top layer 134 formed directly on a leadframe top surface 306 of the leadframe 302. The conductive paddle top layer 114 can be formed at a spacing from the conductive lead top layer 134.

The conductive paddle bottom layer 112, the conductive paddle top layer 114, the conductive lead bottom layer 132, and the conductive lead top layer 134 can be formed with a conductive material including silver (Ag), any other metallic material, a metallic alloy, or a combination thereof. The conductive paddle bottom layer 112, the conductive paddle top layer 114, the conductive lead bottom layer 132, the conductive lead top layer 134, or a combination thereof can be formed with a metal plating process including a pre-plated leadframe (PPF) plating process.

The leadframe 302 can be partially removed. A portion of the leadframe 302 can be removed between the conductive paddle top layer 114 and the conductive lead top layer 134 at the leadframe top surface 306. Another portion of the leadframe 302 can be removed between the conductive lead top layer 134 and another of the conductive lead top layer 134.

The hole 140 can be formed through the conductive lead bottom layer 132, the conductive lead top layer 134, and a portion of the leadframe 302 between the conductive lead bottom layer 132 and the conductive lead top layer 134. The hole 140 can be bounded by non-horizontal sides of the conductive lead bottom layer 132, the conductive lead top layer 134, and the portion of the leadframe 302 between the conductive lead bottom layer 132 and the conductive lead top layer 134.

For example, the leadframe 302 can include an incoming leadframe with the hole 140 formed through leads. Also for example, the hole 140 can be formed with a removal process including etching, laser, mechanical drilling, any other mechanical process, any other chemical process, or a combination thereof.

Figure 4:
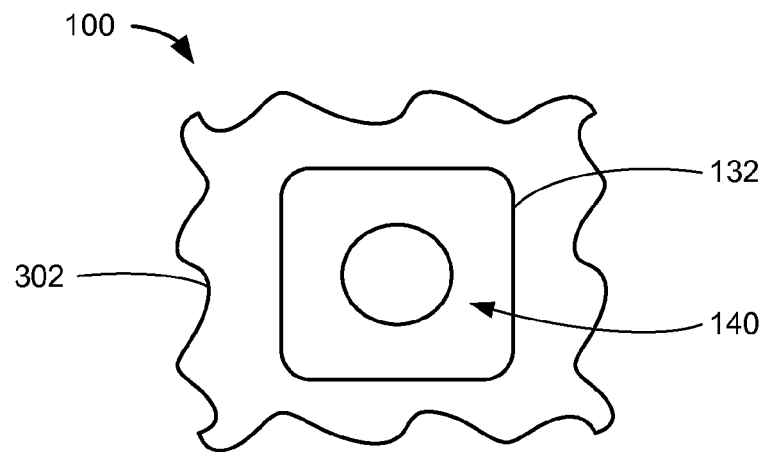
FIG. 4 is a bottom view of the portion of the integrated circuit packaging system.

Referring now to FIG. 4, therein is shown a bottom view of the portion of the integrated circuit packaging system 100. The integrated circuit packaging system 100 can include the conductive lead bottom layer 132 formed at a portion of the leadframe 302.

The hole 140 can be formed at a portion of the conductive lead bottom layer 132. For illustrative purposes, the hole 140 is shown at a central portion of the conductive lead bottom layer 132, although it is understood that the hole 140 can be formed at a non-center offset from a center of the conductive lead bottom layer 132. In other words, a center of the hole 140 can be away from a center of the conductive lead bottom layer 132.

Figure 5:
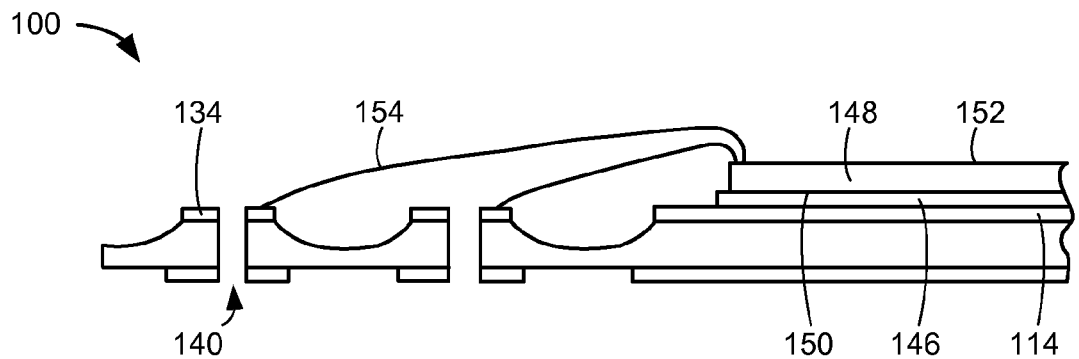
FIG. 5 is the structure of FIG. 3 in a connecting phase.

Referring now to FIG. 5, therein is shown the structure of FIG. 3 in a connecting phase. The integrated circuit packaging system 100 can include the attach layer 146 attached to the conductive paddle top layer 114 and the integrated circuit 148. The attach layer 146 can be formed with an attached material including a die attach material or an adhesive material.

The integrated circuit 148 can include the inactive side 150 and the active side 152. The integrated circuit 148 can be mounted over the conductive paddle top layer 114 with the inactive side 150 facing the conductive paddle top layer 114.

The electrical connector 154 can be connected directly to the conductive lead top layer 134 and the active side 152. The electrical connector 154 can be connected directly to a portion of the conductive lead top layer 134 such that an end of the electrical connector 154 is positioned adjacent the hole 140.

The electrical connector 154 can be formed with an interconnect process including wire bonding. For illustrative purposes, the electrical connector 154 is shown as a bond wire, although it is understood that the electrical connector 154 can be any electrically conductive connector.

Figure 6:
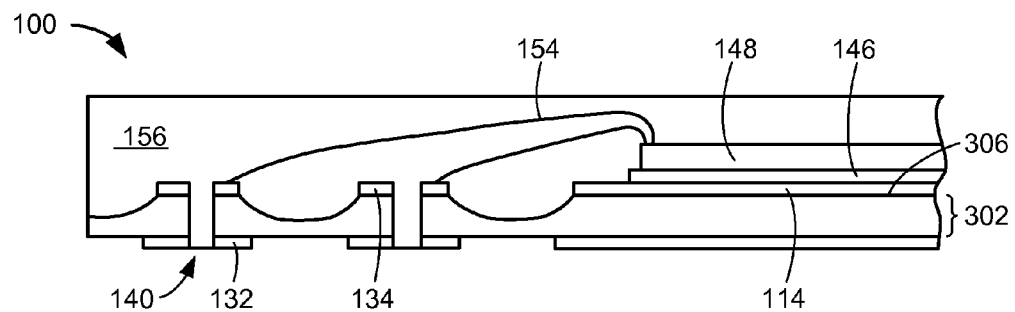
FIG. 6 is the structure of FIG. 5 in a molding phase.

Referring now to FIG. 6, therein is shown the structure of FIG. 5 in a molding phase. The integrated circuit packaging system 100 can include the encapsulation 156 formed over the leadframe 302. The encapsulation 156 can include a cover including an encapsulant or a mold material.

The encapsulation 156 can cover the conductive paddle top layer 114, the conductive lead top layer 134, the attach layer 146, the integrated circuit 148, the electrical connector 154, and portions of the leadframe 302 that are partially removed at the leadframe top surface 306. The encapsulation 156 can be filled within the hole 140. A plane of a portion of the encapsulation 156 can be coplanar with a plane of a portion of a bottom surface of the conductive lead bottom layer 132.

Mold bleed can be prevented with a removable tape applied under the leadframe 302. The removable tape can be applied directly to the conductive lead top layer 134 covering the hole 140. Film-assisted molding can be performed to prevent mold bleed with a bottom mold chase covered with a film.

Figure 7:
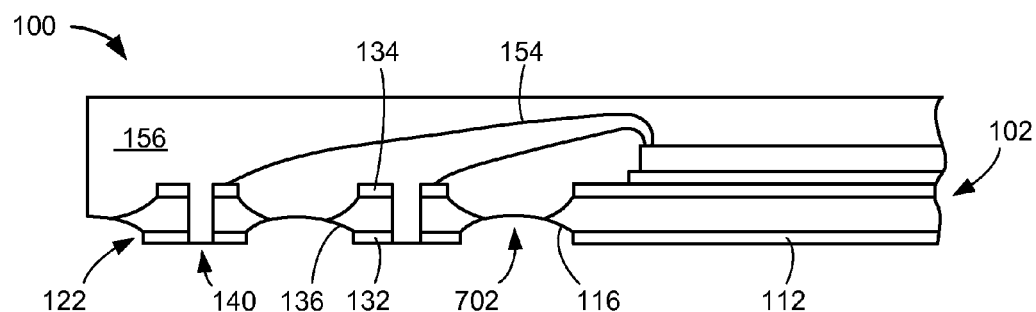
FIG. 7 is the structure of FIG. 6 in a removal phase.

Referring now to FIG. 7, therein is shown the structure of FIG. 6 in a removal phase. The removal phase can include a removal process including a bottom etching process, any other chemical process, a mechanical process, or a combination thereof.

A portion of the leadframe 302 of FIG. 6 can be removed between the conductive paddle bottom layer 112 and the conductive lead bottom layer 132 to form the package paddle 102. Another portion of the leadframe 302 can be removed between the conductive lead bottom layer 132 and another of the conductive lead bottom layer 132 to form the lead 122. The leadframe 302 can be partially removed at the leadframe bottom surface 304 of FIG. 3.

For illustrative purposes, a bottom encapsulation surface 702 of the encapsulation 156 is shown with a concave shape with the removal process, although it is understood that the bottom encapsulation surface 702 can be formed with any shapes including convex, concave, any other curves, or flat. For example, the encapsulation 156 can be formed with the bottom encapsulation surface 702 between the paddle ridge 116 and the lead ridge 136. Also for example, the encapsulation 156 can be formed with another of the bottom encapsulation surface 702 between the lead ridge 136 and another of the lead ridge 136.

For example, the hole 140 can include a diameter in an approximate range of 100 micrometers (um) to 125 micrometers (um). The approximate range of the diameter can be sufficient to form an attachment area on the lead 122.

The attachment area is a surface area of the conductive lead top layer 134 to which the electrical connector 154 is connected. For example, the attachment area can include a length in an approximate range of 50 micrometers (um) to 75 micrometers (um), with the lead 122 having an average size of approximately 250 micrometers (um) in length.

The removal phase can include a package singulation process. The package singulation process can include a mechanical or optical process that can be used to produce individual package units of the integrated circuit packaging system 100.

Figure 8:
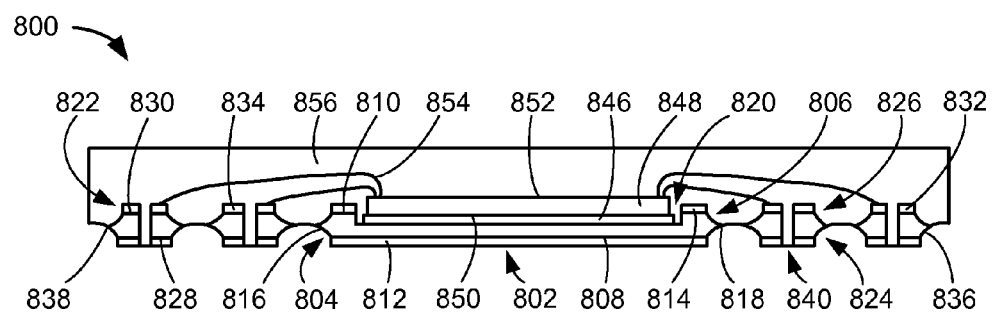
FIG. 8 is a cross-sectional view of a portion of an integrated circuit packaging system in a second embodiment of the present invention.

Referring now to FIG. 8, therein is shown a cross-sectional view of a portion of an integrated circuit packaging system 800 in a second embodiment of the present invention. The integrated circuit packaging system 800 can be formed in a manner similar to the integrated circuit packaging system 100 of FIG. 1, except for the formation of the package paddle 102 of FIG. 1, the attach layer 146 of FIG. 1, and the encapsulation 156 of FIG. 1.

The integrated circuit packaging system 800 can include a package paddle 802, which is a support structure for mounting a semiconductor device thereon. For example, the package paddle 802 can include a support structure including a die pad.

The package paddle 802 can include a paddle body bottom portion 804 and a paddle body top portion 806 above the paddle body bottom portion 804. The paddle body bottom portion 804 and the paddle body top portion 806 are a lower central portion and an upper central portion of the package paddle 802, respectively. The paddle body bottom portion 804 and the paddle body top portion 806 can include a paddle body bottom side 808 and a paddle body top side 810, respectively, opposite the paddle body bottom side 808.

The package paddle 802 can include a conductive paddle bottom layer 812 and a conductive paddle top layer 814, which provide electrical connectivity. The conductive paddle bottom layer 812 and the conductive paddle top layer 814 can be formed directly on the paddle body bottom side 808 and the paddle body top side 810, respectively.

The package paddle 802 can include a paddle ridge 816, which is a protrusion of the package paddle 802. For illustrative purposes, the paddle ridge 816 is shown with a lower surface and an upper surface having a shape of a curve, although it is understood that the lower surface and the upper surface of the paddle ridge 816 can include any other shapes. The upper surface of the paddle ridge 816 is opposite and above the lower surface of the paddle ridge 816.

The paddle ridge 816 laterally extends from the paddle body bottom portion 804 and the paddle body top portion 806. The paddle ridge 816 includes a top portion and a bottom portion laterally extending from the paddle body bottom portion 804 and the paddle body top portion 806, respectively.

The lower surface of the paddle ridge 816 extends from the paddle body bottom side 808 to a paddle tip 818, which is an end of the paddle ridge 816 facing away from the paddle body bottom portion 804 and the paddle body top portion 806. The upper surface of the paddle ridge 816 extends from the paddle body top side 810 to the paddle tip 818. The lower surface of the paddle ridge 816 and the upper surface of the paddle ridge 816 can be below and above, respectively, the paddle tip 818.

The paddle tip 818 can be between a plane of a portion of the paddle body bottom side 808 and a plane of a portion of the paddle body top side 810. The paddle body bottom portion 804 and the paddle body top portion 806 can be above and below, respectively, a plane of the paddle tip 818.

The package paddle 802 can include a paddle recess 820, which is an indentation at a portion of the package paddle 802. The paddle recess 820 can be formed at the paddle body top side 810. For example, the paddle recess 820 can include a half-etched recess area. For illustrative purposes, the paddle recess 820 is shown at a central portion of the package paddle 802, although it is understood that the paddle recess 820 can be at any other portion of the package paddle 802.

The paddle recess 820 can be formed through the conductive paddle top layer 814 and partially through the paddle body top portion 806. In an alternative embodiment, the paddle recess 820 can be formed through the conductive paddle top layer 814, the paddle body top portion 806, and partially through the paddle body bottom portion 804.

The paddle recess 820 can be bounded by non-horizontal sides of the conductive paddle top layer 814 and the paddle body top portion 806. In an alternative embodiment, the paddle recess 820 can be bounded by non-horizontal sides of the conductive paddle top layer 814, the paddle body top portion 806, and the paddle body bottom portion 804.

The integrated circuit packaging system 800 can include a lead 822 having a lead body bottom portion 824 and a lead body top portion 826. The lead body bottom portion 824 and the lead body top portion 826 can include a lead body bottom side 828 and a lead body top side 830, respectively.

The lead 822 can include a conductive lead bottom layer 832 and a conductive lead top layer 834. The lead 822 can include a lead ridge 836 having a lead tip 838. The lead 822 can include a hole 840. The lead 822 can be formed in a manner similar to the lead 122 of FIG. 1.

The integrated circuit packaging system 800 can include an attach layer 846. The attach layer 846 attaches an integrated circuit 848 to the package paddle 802. The attach layer 846 can be attached within the paddle recess 820.

The integrated circuit packaging system 800 can include the integrated circuit 848 having an inactive side 850 and an active side 852. The integrated circuit 848 can be mounted over the package paddle 802 with a portion of the integrated circuit 848 within the paddle recess 820.

The integrated circuit packaging system 800 can include an electrical connector 854. The integrated circuit 848 and the electrical connector 854 can be formed in a manner similar to the integrated circuit 148 of FIG. 1 and the electrical connector 154 of FIG. 1, respectively.

The integrated circuit packaging system 800 can include an encapsulation 856, such as a fill layer 856, which covers a semiconductor package to seal electrical devices providing mechanical and environmental protection. The encapsulation 856 can be formed over the conductive paddle top layer 814, the paddle ridge 816, the conductive lead top layer 834, and the lead ridge 836. The encapsulation 856 can be formed within the paddle recess 820.

The encapsulation 856 can be formed within the hole 840. A plane of a portion of the encapsulation 856 within the hole 840 can be coplanar with a plane of a portion of a bottom surface of the conductive lead bottom layer 832.

The encapsulation 856 can cover a top surface of the paddle ridge 816, the conductive paddle top layer 814, a top surface of the lead ridge 836, the conductive lead top layer 834, the attach layer 846, the integrated circuit 848, and the electrical connector 854. The encapsulation 856 can be formed surrounding a top portion of the paddle ridge 816, the paddle body top portion 806, a top portion of the lead ridge 836, and the lead body top portion 826.

The encapsulation 856 can partially expose the package paddle 802 and the lead 822. The encapsulation 856 can expose a bottom surface of the paddle ridge 816, the conductive paddle bottom layer 812, a bottom surface of the lead ridge 836, and the conductive lead bottom layer 832.

It has been discovered that the package paddle 802 having the paddle recess 820, within which the integrated circuit 848 is attached, significantly reduces a total package height.

Figure 9:
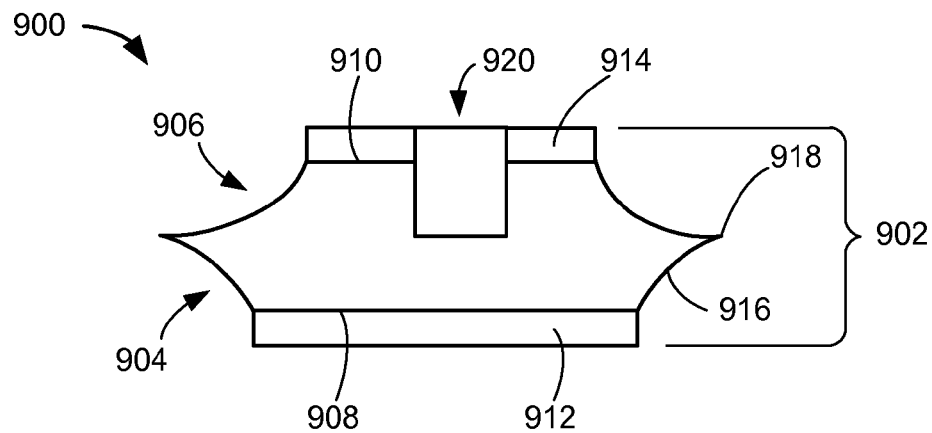
FIG. 9 is a cross-sectional view of a portion of an integrated circuit packaging system in a third embodiment of the present invention.

Referring now to FIG. 9, therein is shown a cross-sectional view of a portion of an integrated circuit packaging system 900 in a third embodiment of the present invention. The cross-sectional view depicts a portion of the integrated circuit packaging system 900. The integrated circuit packaging system 900 can be formed in a manner similar to the integrated circuit packaging system 100 of FIG. 1, except for the formation of the lead 122 of FIG. 1.

The integrated circuit packaging system 900 can include a lead 902, which provides electrical connectivity to external systems (not shown). The lead 902 can include a lead body bottom portion 904 and a lead body top portion 906 above the lead body bottom portion 904. The lead body bottom portion 904 and the lead body top portion 906 are a lower central portion and an upper central portion of the lead 902, respectively. The lead body bottom portion 904 and the lead body top portion 906 can include a lead body bottom side 908 and a lead body top side 910, respectively, opposite the lead body bottom side 908.

The lead 902 can include a conductive lead bottom layer 912 and a conductive lead top layer 914, which provide electrical connectivity. The conductive lead bottom layer 912 and the conductive lead top layer 914 can be formed directly on the lead body bottom side 908 and the lead body top side 910, respectively.

The lead 902 can include a lead ridge 916, which is a protrusion of the lead 902. For illustrative purposes, the lead ridge 916 is shown with a bottom surface and a top surface having a shape of a curve, although it is understood that the bottom surface and the top surface of the lead ridge 916 can include any other shapes. The upper surface of the lead ridge 916 is opposite and above the lower surface of the lead ridge 916.

The lead ridge 916 laterally extends from the lead body bottom portion 904 and the lead body top portion 906. In other words, the lead ridge 916 includes a bottom portion and a top portion laterally extending from the lead body bottom portion 904 and the lead body top portion 906, respectively.

The lower surface of the lead ridge 916 extends from the lead body bottom side 908 to a lead tip 918, which is an end of the lead ridge 916 facing away from the lead body bottom portion 904 and the lead body top portion 906. The upper surface of the lead ridge 916 extends from the lead body top side 910 to the lead tip 918. The lower surface of the lead ridge 916 and the upper surface of the lead ridge 916 can be below and above, respectively, the lead tip 918.

The lead tip 918 can be between a plane of a portion of the lead body bottom side 908 and a plane of a portion of the lead body top side 910. The lead body bottom portion 904 and the lead body top portion 906 can be above and below, respectively, a plane of the lead tip 918.

The lead 902 can include a hole 920 formed through the conductive lead top layer 914 and partially through the lead body top portion 906. In an alternative embodiment, the hole 920 can be formed through the conductive lead top layer 914, the lead body top portion 906, and partially through the lead body bottom portion 904.

The hole 920 can be formed in the lead body top side 910. For example, the hole 920 can include a partial hole instead of a through hole. Also for example, the integrated circuit packaging system 900 can include a package paddle (not shown) having a partial hole, which is formed partially through the package paddle at a die paddle area of the package paddle.

It has been discovered that the lead 902 having the lead ridge 916 and the hole 920 formed through the conductive lead top layer 914 and partially through the lead body top portion 906 provides structure integrity without lead pullout and misalignment.

Figure 10:
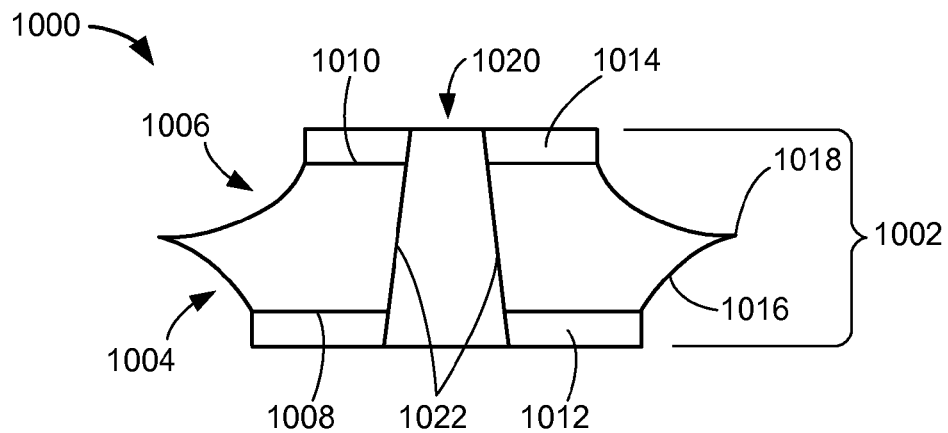
FIG. 10 is a cross-sectional view of a portion of an integrated circuit packaging system in a fourth embodiment of the present invention.

Referring now to FIG. 10, therein is shown a cross-sectional view of a portion of an integrated circuit packaging system 1000 in a fourth embodiment of the present invention. The cross-sectional view depicts a portion of the integrated circuit packaging system 1000. The integrated circuit packaging system 1000 can be formed in a manner similar to the integrated circuit packaging system 100 of FIG. 1, except for the formation of the lead 122 of FIG. 1.

The integrated circuit packaging system 1000 can include a lead 1002, which provides electrical connectivity to external systems (not shown). The lead 1002 can include a lead body bottom portion 1004 and a lead body top portion 1006 above the lead body bottom portion 1004. The lead body bottom portion 1004 and the lead body top portion 1006 are a lower central portion and an upper central portion of the lead 1002, respectively. The lead body bottom portion 1004 and the lead body top portion 1006 can include a lead body bottom side 1008 and a lead body top side 1010, respectively, opposite the lead body bottom side 1008.

The lead 1002 can include a conductive lead bottom layer 1012 and a conductive lead top layer 1014, which provide electrical connectivity. The conductive lead bottom layer 1012 and the conductive lead top layer 1014 can be formed directly on the lead body bottom side 1008 and the lead body top side 1010, respectively.

The lead 1002 can include a lead ridge 1016, which is a protrusion of the lead 1002. For illustrative purposes, the lead ridge 1016 is shown with a bottom surface and a top surface having a shape of a curve, although it is understood that the bottom surface and the top surface of the lead ridge 1016 can include any other shapes. The upper surface of the lead ridge 1016 is opposite and above the lower surface of the lead ridge 1016.

The lead ridge 1016 laterally extends from the lead body bottom portion 1004 and the lead body top portion 1006. In other words, the lead ridge 1016 includes a bottom portion and a top portion laterally extending from the lead body bottom portion 1004 and the lead body top portion 1006, respectively.

The lower surface of the lead ridge 1016 extends from the lead body bottom side 1008 to a lead tip 1018, which is an end of the lead ridge 1016 facing away from the lead body bottom portion 1004 and the lead body top portion 1006. The upper surface of the lead ridge 1016 extends from the lead body top side 1010 to the lead tip 1018. The lower surface of the lead ridge 1016 and the upper surface of the lead ridge 1016 can be below and above, respectively, the lead tip 1018.

The lead tip 1018 can be between a plane of a portion of the lead body bottom side 1008 and a plane of a portion of the lead body top side 1010. The lead body bottom portion 1004 and the lead body top portion 1006 can be above and below, respectively, a plane of the lead tip 1018.

The lead 1002 can include a hole 1020 formed through the conductive lead bottom layer 1012, the lead body bottom portion 1004, the lead body top portion 1006, and the conductive lead top layer 1014. A top opening of the hole 1020 can be smaller than a bottom opening of the hole 1020.

The hole 1020 can be formed in the lead body top side 1010. The hole 1020 can be formed extending from a bottom surface of the conductive lead bottom layer 1012 to a top surface of the conductive lead top layer 1014.

The lead 1002 can include a lead side 1022, which is an inner surface of the lead 1002 that surrounds the hole 1020 defining outer limits of the hole 1020. In other words, the hole 1020 is bounded by the lead side 1022.

The lead side 1022 can include non-horizontal sides of the lead body bottom portion 1004, the lead body top portion 1006, the conductive lead bottom layer 1012, and the conductive lead top layer 1014. For illustrative purposes, the lead side 1022 is shown with a straight shape, although it is understood that the lead side 1022 can include any other shapes including a curve.

A plane of the lead side 1022 can be oblique to a plane of a surface of the lead body bottom portion 1004, the lead body top portion 1006, the conductive lead bottom layer 1012, or the conductive lead top layer 1014. For example, the plane of the lead side 1022 can be oblique to a plane of a bottom surface of the conductive lead bottom layer 1012. Also for example, the plane of the lead side 1022 can be sloped with respect to a plane of a surface of the lead body bottom portion 1004, the lead body top portion 1006, the conductive lead bottom layer 1012, or the conductive lead top layer 1014.

It has been discovered that the lead 1002 having the lead ridge 1016 and the hole 1020 with the lead side 1022 provides structure integrity without lead pullout and misalignment.

Figure 11:
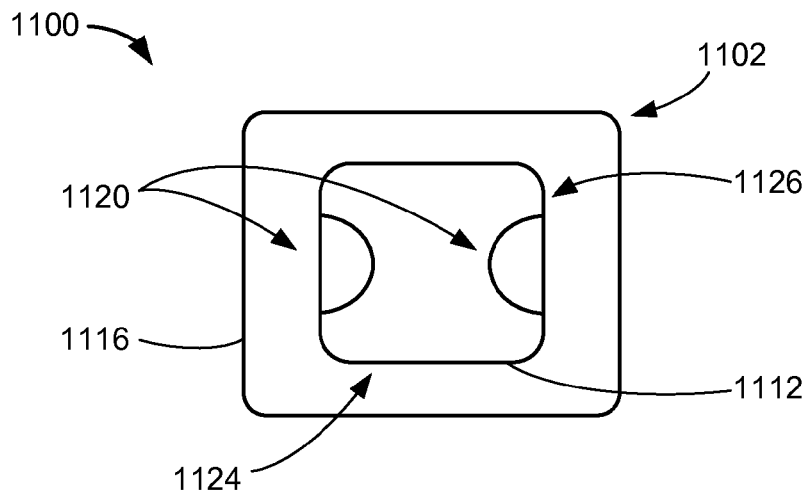
FIG. 11 is a bottom view of a portion of an integrated circuit packaging system in a fifth embodiment of the present invention.

Referring now to FIG. 11, therein is shown a bottom view of a portion of an integrated circuit packaging system 1100 in a fifth embodiment of the present invention. The integrated circuit packaging system 1100 can be formed in a manner similar to the integrated circuit packaging system 100 of FIG. 1, except for the formation of the lead 122 of FIG. 1.

The integrated circuit packaging system 1100 can include a lead 1102, which provides electrical connectivity to external systems (not shown). The lead 1102 can include a conductive lead bottom layer 1112, which provides electrical connectivity.

The lead 1102 can include a lead ridge 1116, which is a protrusion of the lead 1102, laterally extending from and surrounding the conductive lead bottom layer 1112. For illustrative purposes, the lead ridge 1116 is shown as a square, although it is understood that the lead ridge 1116 can include any shapes.

The lead 1102 can include holes 1120 formed through the conductive lead bottom layer 1112. The holes 1120 can be formed adjacent and within a bottom layer periphery 1124 of the conductive lead bottom layer 1112. The bottom layer periphery 1124 defines a boundary of a planar surface of the conductive lead bottom layer 1112.

The holes 1120 can be formed at the bottom layer periphery 1124. The holes 1120 can be formed at opposite bottom layer sides 1126 of the conductive lead bottom layer 1112. The bottom layer sides 1126 define the bottom layer periphery 1124. For example, one of the holes 1120 can be formed at one of the bottom layer sides 1126 and another of the holes 1120 can be formed at another of the bottom layer sides 1126 opposite the one of the bottom layer sides 1126.

For illustrative purposes, the lead 1102 is shown with two of the holes 1120, although it is understood that the lead 1102 can include any number of the holes 1120. Also for illustrative purposes, the holes 1120 are shown with a shape of a hemisphere, although it is understood that the holes 1120 can include any other shapes.

It has been discovered that the lead 1102 having the lead ridge 1116 and the holes 1120 formed through the conductive lead bottom layer 1112 provides structure integrity without lead pullout and misalignment.

Figure 12:
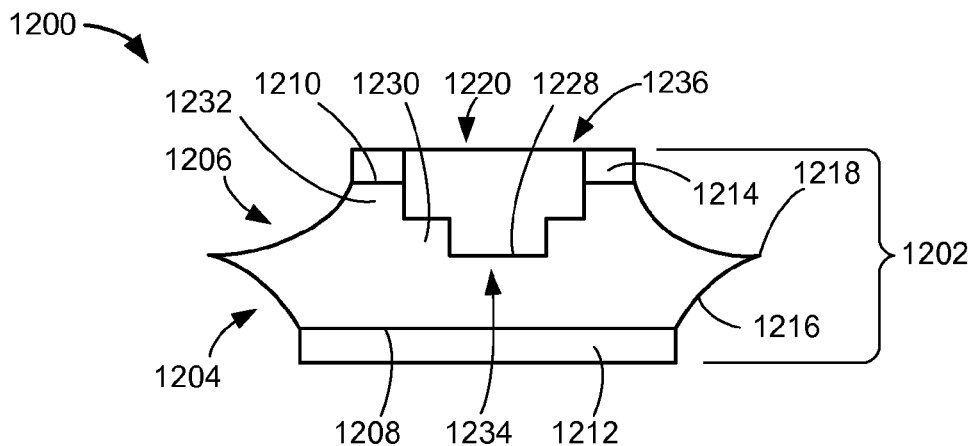
FIG. 12 is a cross-sectional view of an integrated circuit packaging system taken along line 12-12 of FIG. 13 in a sixth embodiment of the present invention.
Figure 13:
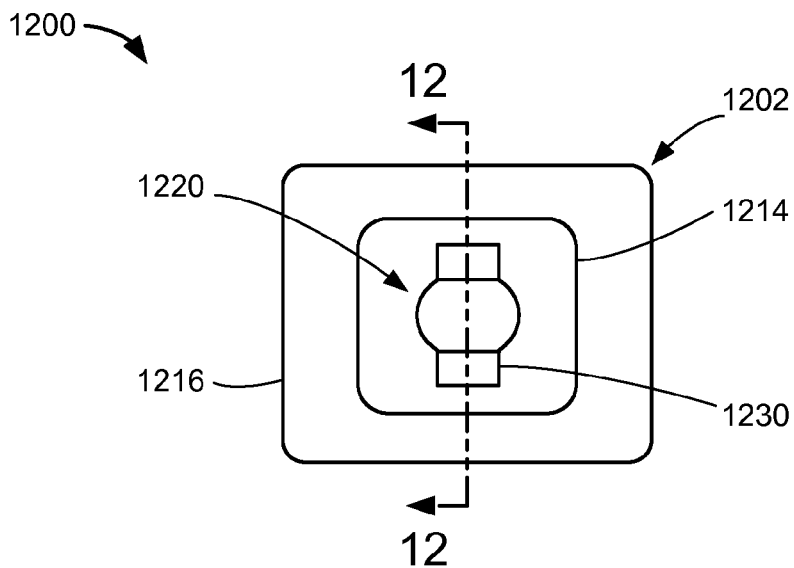
FIG. 13 is a top view of the integrated circuit packaging system.

Referring now to FIG. 12, therein is shown a cross-sectional view of an integrated circuit packaging system 1200 taken along line 12-12 of FIG. 13 in a sixth embodiment of the present invention. The cross-sectional view depicts a portion of the integrated circuit packaging system 1200. The integrated circuit packaging system 1200 can be formed in a manner similar to the integrated circuit packaging system 100 of FIG. 1, except for the formation of the lead 122 of FIG. 1.

The integrated circuit packaging system 1200 can include a lead 1202, which provides electrical connectivity to external systems (not shown). The lead 1202 can include a lead body bottom portion 1204 and a lead body top portion 1206 above the lead body bottom portion 1204. The lead body bottom portion 1204 and the lead body top portion 1206 are a lower central portion and an upper central portion of the lead 1202, respectively. The lead body bottom portion 1204 and the lead body top portion 1206 can include a lead body bottom side 1208 and a lead body top side 1210, respectively, opposite the lead body bottom side 1208.

The lead 1202 can include a conductive lead bottom layer 1212 and a conductive lead top layer 1214, which provide electrical connectivity. The conductive lead bottom layer 1212 and the conductive lead top layer 1214 can be formed directly on the lead body bottom side 1208 and the lead body top side 1210, respectively.

The lead 1202 can include a lead ridge 1216, which is a protrusion of the lead 1202. For illustrative purposes, the lead ridge 1216 is shown with a bottom surface and a top surface having a shape of a curve, although it is understood that the bottom surface and the top surface of the lead ridge 1216 can include any other shapes. The upper surface of the lead ridge 1216 is opposite and above the lower surface of the lead ridge 1216.

The lead ridge 1216 laterally extends from the lead body bottom portion 1204 and the lead body top portion 1206. In other words, the lead ridge 1216 includes a bottom portion and a top portion laterally extending from the lead body bottom portion 1204 and the lead body top portion 1206, respectively.

The lower surface of the lead ridge 1216 extends from the lead body bottom side 1208 to a lead tip 1218, which is an end of the lead ridge 1216 facing away from the lead body bottom portion 1204 and the lead body top portion 1206. The upper surface of the lead ridge 1216 extends from the lead body top side 1210 to the lead tip 1218. The lower surface of the lead ridge 1216 and the upper surface of the lead ridge 1216 can be below and above, respectively, the lead tip 1218.

The lead tip 1218 can be between a plane of a portion of the lead body bottom side 1208 and a plane of a portion of the lead body top side 1210. The lead body bottom portion 1204 and the lead body top portion 1206 can be above and below, respectively, a plane of the lead tip 1218.

The lead 1202 can include a hole 1220 formed through the conductive lead top layer 1214 and partially through the lead body top portion 1206. In an alternative embodiment, the hole 1220 can be formed through the conductive lead top layer 1214, the lead body top portion 1206, and partially through the lead body bottom portion 1204. The hole 1220 can be formed in the lead body top side 1210. For example, the hole 1220 can include a step hole.

The lead 1202 can include an inner surface 1228, which is a bottom surface, within the hole 1220. The lead 1202 can include a lower step 1230, which is a lower elevated portion, in or within the hole 1220 and above the inner surface 1228. The lead 1202 can include an upper step 1232, which is an upper elevated portion, within the hole 1220 and above the lower step 1230. The lead 1202 can include the lower step 1230 extending from the inner surface 1228. The lead 1202 can include the upper step 1232 extending from the lower step 1230.

The hole 1220 can be bounded by non-horizontal sides of the lower step 1230 and the upper step 1232 in the horizontal direction. The hole 1220 can be bounded by the inner surface 1228 in the vertical direction. A width of a portion of the hole 1220 that is bounded by non-horizontal sides of the lower step 1230 can be less than a width of another portion of the hole 1220 that is bounded by non-horizontal sides of the upper step 1232.

A combined height of the lower step 1230 and the upper step 1232 can be approximately equal to a height of the lead body top portion 1206. For example, the combined height can include depths of the lower step 1230 and the upper step 1232.

The hole 1220 can include a lower end 1234 and an open upper end 1236 opposite the lower end 1234. The lower end 1234 and the open upper end 1236 are a bottom extent and a top extent, respectively, of the hole 1220. The open upper end 1236 is at a top surface of the conductive lead top layer 1214.

It has been discovered that the lead 1202 having the lead ridge 1216 and the hole 1220 with the lower step 1230 and the upper step 1232 within thereof provides structure integrity without lead pullout and misalignment.

Referring now to FIG. 13, therein is shown a top view of the integrated circuit packaging system 1200. The lead 1202 can include the conductive lead top layer 1214. The lead 1202 can include the lead ridge 1216 laterally extending from and surrounding the conductive lead top layer 1214. For illustrative purposes, the conductive lead top layer 1214 and the lead ridge 1216 are shown with a shape of a square, although it is understood that the conductive lead top layer 1214 and the lead ridge 1216 can include any shapes.

The lead 1202 can include the hole 1220 formed at a portion of the conductive lead top layer 1214. For illustrative purposes, the hole 1220 is shown at a central portion of the conductive lead top layer 1214, although it is understood that the hole 1220 can be formed at any portion of the conductive lead top layer 1214.

The lead 1202 can include a number of the lower step 1230 formed at opposite sides of the hole 1220 and facing one another. For example, the lead 1202 can include the lower step 1230 formed at a side of the hole 1220 and another of the lower step 1230 facing the lower step 1230 and formed at another side of the hole 1220 opposite the side.

Figure 14:
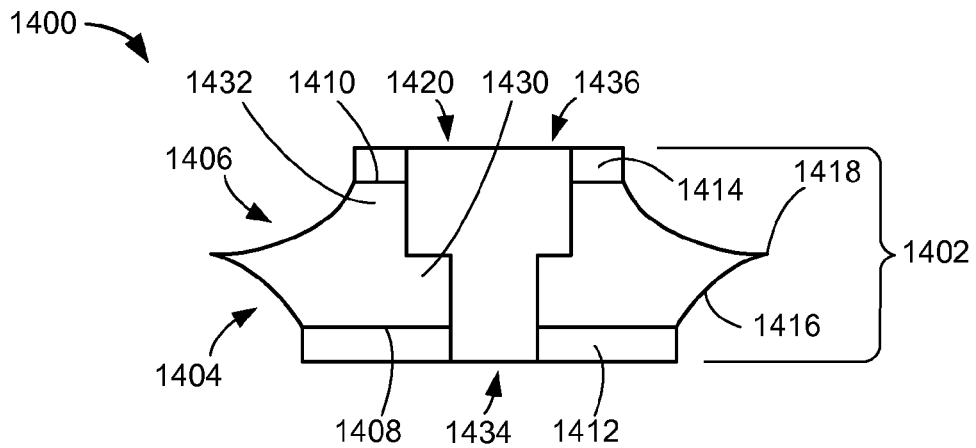
FIG. 14 is a cross-sectional view of an integrated circuit packaging system in a seventh embodiment of the present invention.

Referring now to FIG. 14, therein is shown a cross-sectional view of an integrated circuit packaging system 1400 in a seventh embodiment of the present invention. The cross-sectional view depicts a portion of the integrated circuit packaging system 1400. The integrated circuit packaging system 1400 can be formed in a manner similar to the integrated circuit packaging system 100 of FIG. 1, except for the formation of the lead 122 of FIG. 1.

The integrated circuit packaging system 1400 can include a lead 1402, which provides electrical connectivity to external systems (not shown). The lead 1402 can include a lead body bottom portion 1404 and a lead body top portion 1406 above the lead body bottom portion 1404. The lead body bottom portion 1404 and the lead body top portion 1406 are a lower central portion and an upper central portion of the lead 1402, respectively. The lead body bottom portion 1404 and the lead body top portion 1406 can include a lead body bottom side 1408 and a lead body top side 1410, respectively, opposite the lead body bottom side 1408.

The lead 1402 can include a conductive lead bottom layer 1412 and a conductive lead top layer 1414, which provide electrical connectivity. The conductive lead bottom layer 1412 and the conductive lead top layer 1414 can be formed directly on the lead body bottom side 1408 and the lead body top side 1410, respectively.

The lead 1402 can include a lead ridge 1416, which is a protrusion of the lead 1402. For illustrative purposes, the lead ridge 1416 is shown with a bottom surface and a top surface having a shape of a curve, although it is understood that the bottom surface and the top surface of the lead ridge 1416 can include any other shapes. The upper surface of the lead ridge 1416 is opposite and above the lower surface of the lead ridge 1416.

The lead ridge 1416 laterally extends from the lead body bottom portion 1404 and the lead body top portion 1406. In other words, the lead ridge 1416 includes a bottom portion and a top portion laterally extending from the lead body bottom portion 1404 and the lead body top portion 1406, respectively.

The lower surface of the lead ridge 1416 extends from the lead body bottom side 1408 to a lead tip 1418, which is an end of the lead ridge 1416 facing away from the lead body bottom portion 1404 and the lead body top portion 1406. The upper surface of the lead ridge 1416 extends from the lead body top side 1410 to the lead tip 1418. The lower surface of the lead ridge 1416 and the upper surface of the lead ridge 1416 can be below and above, respectively, the lead tip 1418.

The lead tip 1418 can be between a plane of a portion of the lead body bottom side 1408 and a plane of a portion of the lead body top side 1410. The lead body bottom portion 1404 and the lead body top portion 1406 can be above and below, respectively, a plane of the lead tip 1418.

The lead 1402 can include a hole 1420 formed through the conductive lead bottom layer 1412, the lead body bottom portion 1404, the lead body top portion 1406, and the conductive lead top layer 1414. The hole 1420 can be formed extending from a bottom surface of the conductive lead bottom layer 1412 to a top surface of the conductive lead top layer 1414. The hole 1420 can be formed in the lead body top side 1410.

The lead 1402 can include a lower step 1430, which is a lower elevated portion, in or within the hole 1420 and above the lead body bottom side 1408. The lead 1402 can include an upper step 1432, which is an upper elevated portion, within the hole 1420 and above the lower step 1430.

The lead 1402 can include a number of the lower step 1430 formed at opposite sides of the hole 1420 and facing one another. For example, the lead 1402 can include the lower step 1430 formed at a side of the hole 1420 and another of the lower step 1430 facing the lower step 1430 and formed at another side of the hole 1420 opposite the side.

The lead 1402 can include a number of the upper step 1432 formed at opposite sides of the hole 1420 and facing one another. For example, the lead 1402 can include the upper step 1432 formed at a side of the hole 1420 and another of the upper step 1432 facing the upper step 1432 and formed at another side of the hole 1420 opposite the side.

The lead 1402 can include the lower step 1430 extending from the lead body bottom side 1408. The lead 1402 can include the upper step 1432 extending from the lower step 1430. A top surface of the upper step 1432 defines a portion of the lead body top side 1410.

The hole 1420 can be bounded by non-horizontal sides of the conductive lead bottom layer 1412, the conductive lead top layer 1414, the lower step 1430, and the upper step 1432 in the horizontal direction. A width of a portion of the hole 1420 that is bounded by non-horizontal sides of the lower step 1430 can be less than a width of another portion of the hole 1420 that is bounded by non-horizontal sides of the upper step 1432.

A height of the upper step 1432 can be approximately equal to a height of the lead body top portion 1406. The height of the upper step 1432 is defined as a distance from a top surface of the lower step 1430 to a top surface of the upper step 1432.

For example, the height of the upper step 1432 can include a depth of the upper step 1432. Also for example, the height of the upper step 1432 can be approximately equal to a partially removed portion of the leadframe 302 of FIG. 3 at the leadframe top surface 306 of FIG. 3. Further, for example, the partially removed portion can include a half-etched recess.

The hole 1420 can include an open lower end 1434 and an open upper end 1436 opposite the open lower end 1434. The open lower end 1434 and the open upper end 1436 are a bottom extent and a top extent, respectively, of the hole 1420. The open lower end 1434 and the open upper end 1436 are at a bottom surface of the conductive lead bottom layer 1412 and a top surface of the conductive lead top layer 1414, respectively.

It has been discovered that the lead 1402 having the lead ridge 1416 and the hole 1420 with the lower step 1430 and the upper step 1432 within thereof provides structure integrity without lead pullout and misalignment.

Figure 15:
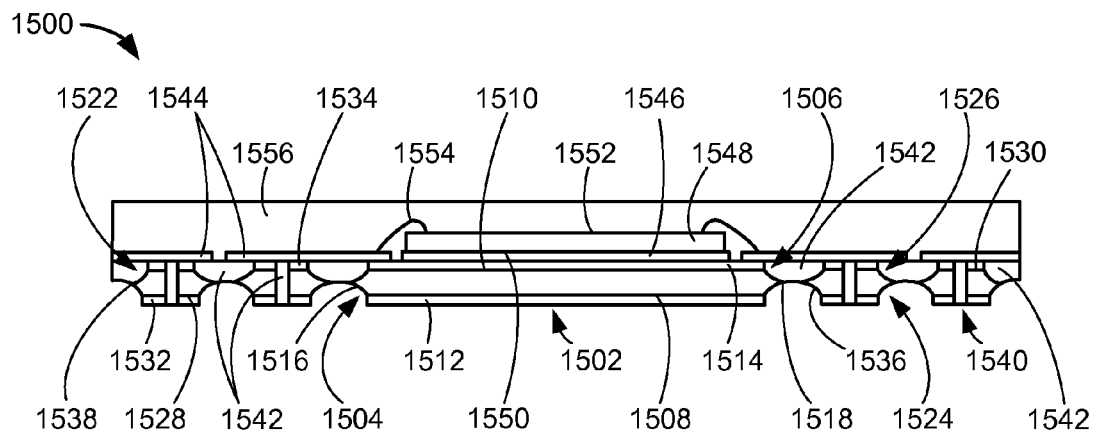
FIG. 15 is a cross-sectional view of an integrated circuit packaging system in an eighth embodiment of the present invention.

Referring now to FIG. 15, therein is shown a cross-sectional view of an integrated circuit packaging system 1500 in an eighth embodiment of the present invention. The integrated circuit packaging system 1500 can be formed in a manner similar to the integrated circuit packaging system 100 of FIG. 1, except for additions of insulation and conductive layers and the formation of the electrical connector 154 of FIG. 1 and the encapsulation 156 of FIG. 1.

The integrated circuit packaging system 1500 can include a package paddle 1502 having a paddle body bottom portion 1504 and a paddle body top portion 1506. The paddle body bottom portion 1504 and the paddle body top portion 1506 can include a paddle body bottom side 1508 and a paddle body top side 1510, respectively.

The package paddle 1502 can include a conductive paddle bottom layer 1512, a conductive paddle top layer 1514, and a paddle ridge 1516 having a paddle tip 1518. The package paddle 1502 can be formed in a manner similar to the package paddle 102 of FIG. 1.

The integrated circuit packaging system 1500 can include a lead 1522 having a lead body bottom portion 1524 and a lead body top portion 1526. The lead body bottom portion 1524 and the lead body top portion 1526 can include a lead body bottom side 1528 and a lead body top side 1530, respectively.

The lead 1522 can include a conductive lead bottom layer 1532 and a conductive lead top layer 1534. The lead 1522 can include a lead ridge 1536 having a lead tip 1538. The lead 1522 can include a hole 1540. The lead 1522 can be formed in a manner similar to the lead 122 of FIG. 1.

The integrated circuit packaging system 1500 can include a passivation layer 1542, such as a base fill layer 1542, which protects the conductive paddle top layer 1514, the paddle ridge 1516, the conductive lead top layer 1534, and the lead ridge 1536 from contamination. The passivation layer 1542 electrically insulates the package paddle 1502 and the lead 1522.

The passivation layer 1542 can be filled within the hole 1540. The passivation layer 1542 can be formed to cover a non-horizontal side of the conductive paddle top layer 1514, a top surface of the paddle ridge 1516, a non-horizontal side of the conductive lead top layer 1534, and a top surface of the lead ridge 1536.

The passivation layer 1542 can be applied between surfaces of the paddle ridge 1516 and the conductive paddle top layer 1514 and surfaces of the lead ridge 1536 and the conductive lead top layer 1534. The passivation layer 1542 can be applied between surfaces of the lead ridge 1536 and the conductive lead top layer 1534 and surfaces of another of the lead ridge 1536 and another of the conductive lead top layer 1534 of another of the lead 1522.

For illustrative purposes, a bottom passivation surface of the passivation layer 1542 is shown with a concave shape, although it is understood that the bottom passivation surface can be formed with any shapes including convex, concave, any other curves, or flat. For example, the passivation layer 1542 can be formed with the bottom passivation surface between the paddle ridge 1516 and the lead ridge 1536. Also for example, the passivation layer 1542 can be formed with another of the bottom passivation surface between the lead ridge 1536 and another of the lead ridge 1536.

The integrated circuit packaging system 1500 can include a redistribution layer 1544 (RDL) formed directly on the conductive paddle top layer 1514, the conductive lead top layer 1534, the passivation layer 1542, or a combination thereof. The redistribution layer 1544 is an electrically conductive layer that is connected to the package paddle 1502, the lead 1522, a connector, or a combination thereof. The redistribution layer 1544 can be formed with an electrically conductive material with a patterning process.

The integrated circuit packaging system 1500 can include an attach layer 1546 and an integrated circuit 1548 having an inactive side 1550 and an active side 1552. The attach layer 1546 and the integrated circuit 1548 can be formed in a manner similar to the attach layer 146 of FIG. 1 and the integrated circuit 148 of FIG. 1, respectively.

The integrated circuit packaging system 1500 can include an electrical connector 1554, which connects the integrated circuit 1548 and the redistribution layer 1544. The electrical connector 1554 can be connected directly to the active side 1552 and the redistribution layer 1544. The electrical connector 1554 can be electrically connected to the package paddle 1502, the lead 1522, or a combination thereof with the electrical connector 1554.

The electrical connector 1554 can be connected directly to a peripheral portion of the integrated circuit 1548 at the active side 1552. The integrated circuit packaging system 1500 can include a number of the electrical connector 1554 electrically connected to a number of the lead 1522.

The integrated circuit packaging system 1500 can include an encapsulation 1556, such as a top fill layer 1556, which covers a semiconductor package to seal electrical devices providing mechanical and environmental protection. The encapsulation 1556 can be formed over the conductive paddle top layer 1514, the conductive lead top layer 1534, and the passivation layer 1542.

The encapsulation 1556 can cover the conductive paddle top layer 1514, the conductive lead top layer 1534, the passivation layer 1542, the redistribution layer 1544, the attach layer 1546, the integrated circuit 1548, and the electrical connector 1554. The encapsulation 1556 can partially expose the package paddle 1502, the lead 1522, and the passivation layer 1542. The encapsulation 1556 can expose a bottom surface of the paddle ridge 1516, the conductive paddle bottom layer 1512, a bottom surface of the lead ridge 1536, the conductive lead bottom layer 1532, and a bottom surface of the passivation layer 1542.

A plane of a portion of a bottom surface of the passivation layer 1542 within the hole 1540 can be coplanar with a plane of a portion of a bottom surface of the conductive lead bottom layer 1532. A plane of a portion of a top surface of the passivation layer 1542 within the hole 1540 can be coplanar with a plane of a portion of a top surface of the conductive lead top layer 1534.

A plane of a portion of a top surface of the passivation layer 1542 between the package paddle 1502 and the lead 1522 can be coplanar with a plane of a portion of a top surface of the conductive lead top layer 1534. A plane of a portion of a top surface of the passivation layer 1542 between the lead 1522 and another of the lead 1522 can be coplanar with a plane of a portion of a top surface of the conductive lead top layer 1534.

It has been discovered that the lead 1522 having the lead ridge 1536 and the hole 1540 filled with the passivation layer 1542 provides structure integrity without lead pullout and misalignment.

Figure 16:
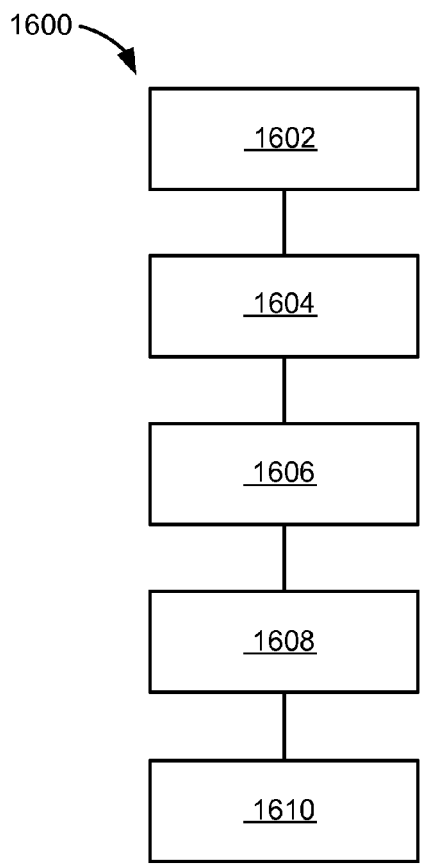
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: forming a package paddle in a block 1602; forming a lead adjacent the package paddle, the lead having a hole in a lead body top side and a lead ridge protruding from a lead non-horizontal side in a block 1604; mounting an integrated circuit over the package paddle in a block 1606; connecting an electrical connector to the lead and the integrated circuit in a block 1608; and forming a fill layer within the hole in a block 1610.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a package paddle;
   forming a lead adjacent the package paddle, the lead having a hole in a lead body top side and a lead ridge protruding from a lead non-horizontal side, wherein forming the lead includes forming the lead having a lower step in the hole and an inner surface at a lower end of the hole;
   attaching an attach layer to the package paddle;
   mounting an integrated circuit over the package paddle with the attach layer attached to the integrated circuit;
   connecting an electrical connector to the lead and the integrated circuit; and
   forming a fill layer exposing a bottom surface of the lead ridge and within the hole.

2. The method as claimed in claim 1 wherein forming the fill layer includes forming a passivation layer within the hole.

3. A method of manufacture of an integrated circuit packaging system comprising:
   forming a package paddle;
   forming a lead adjacent the package paddle, the lead having a hole in a lead body top side and a lead ridge protruding from a lead non-horizontal side, wherein forming the lead includes forming the lead having a lower step in the hole and an open lower end of the hole;
   attaching an attach layer to the package paddle;
   mounting an integrated circuit over the package paddle with the attach layer attached to the integrated circuit;
   connecting an electrical connector to the lead and the integrated circuit; and
   forming a fill layer exposing a bottom surface of the lead ridge and within the hole.

4. The method as claimed in claim 3 wherein forming the fill layer includes forming a passivation layer within the hole.

5. An integrated circuit packaging system comprising:
   a package paddle;
   a lead adjacent the package paddle, the lead having a hole in a lead body top side and a lead ridge protruding from a lead non-horizontal side, wherein the lead includes a lower step in the hole and an inner surface at a lower end of the hole;
   an attach layer attached to the package paddle;
   an integrated circuit over the package paddle, wherein the integrated circuit is over the package paddle with the attach layer attached to the integrated circuit;
   an electrical connector connected to the lead and the integrated circuit;
   a fill layer exposing a bottom surface of the lead ridge and within the hole.

6. The system as claimed in claim 5 wherein the lead includes a conductive lead top layer with the hole therethrough.

7. The system as claimed in claim 5 wherein the fill layer is coplanar with a conductive lead bottom layer of the lead.

8. The system as claimed in claim 5 wherein the package paddle includes a paddle recess with the integrated circuit mounted within the paddle recess.

9. The system as claimed in claim 5 wherein the lead includes a conductive lead bottom layer and the hole at a bottom layer periphery of the conductive lead bottom layer.

10. The system as claimed in claim 5 wherein the fill layer is a passivation layer within the hole.

11. An integrated circuit packaging system comprising:
    a package paddle;
    a lead adjacent the package paddle, the lead having a hole in a lead body top side and a lead ridge protruding from a lead non-horizontal side, wherein the lead includes a lower step in the hole and an open lower end of the hole
    an attach layer attached to the package paddle;
    an integrated circuit over the package paddle, wherein the integrated circuit is over the package paddle with the attach layer attached to the integrated circuit;
    an electrical connector connected to the lead and the integrated circuit;
    a fill layer exposing a bottom surface of the lead ridge and within the hole.

12. The system as claimed in claim 11 wherein the fill layer is a passivation layer within the hole.

13. The system as claimed in claim 11 wherein the lead includes a conductive lead top layer with the hole therethrough.

14. The system as claimed in claim 11 wherein the fill layer is coplanar with a conductive lead bottom layer of the lead.

15. The system as claimed in claim 11 wherein the package paddle includes a paddle recess with the integrated circuit mounted within the paddle recess.

16. The system as claimed in claim 11 wherein the lead includes a conductive lead bottom layer and the hole at a bottom layer periphery of the conductive lead bottom layer.

\* \* \* \* \*